United States Patent
Hozoi et al.

(10) Patent No.: US 9,299,484 B2
(45) Date of Patent: Mar. 29, 2016

(54) RESISTIVE STRUCTURE AND RESISTIVE VOLTAGE DIVIDER ARRANGEMENT

(71) Applicant: ABB AG, Mannheim (DE)

(72) Inventors: Adrian Hozoi, Mannheim (DE); Rolf Disselnkötter, Mauer (DE); Marek Pavlas, Otnice (CZ)

(73) Assignee: ABB AG, Mannheim (DE)

( * ) Notice: Subject to any disclaimer, the term of this patent is extended or adjusted under 35 U.S.C. 154(b) by 165 days.

(21) Appl. No.: 14/010,013

(22) Filed: Aug. 26, 2013

(65) Prior Publication Data

US 2013/0342227 A1   Dec. 26, 2013

Related U.S. Application Data

(63) Continuation of application No. PCT/EP2012/000818, filed on Feb. 25, 2012.

(30) Foreign Application Priority Data

Feb. 25, 2011   (EP) .................................... 11001582

(51) Int. Cl.
*H01C 7/22* (2006.01)
*H01C 10/16* (2006.01)
(Continued)

(52) U.S. Cl.
CPC ........ *H01C 1/00* (2013.01); *G01R 15/04* (2013.01); *G01R 19/0084* (2013.01); *H01C 7/003* (2013.01); *H01C 7/22* (2013.01); *H01C 17/065* (2013.01)

(58) Field of Classification Search
CPC ....... G01R 27/02; G01R 33/09; G01R 33/093
USPC ............ 324/691, 421, 207.21, 525, 549, 727, 324/416, 522; 338/321–334, 306–314, 338/226–276, 64–66, 11–47
See application file for complete search history.

(56) References Cited

U.S. PATENT DOCUMENTS

| 5,521,576 A | 5/1996 | Collins |
| 6,111,494 A | 8/2000 | Fischer et al. |

(Continued)

FOREIGN PATENT DOCUMENTS

| CN | 101577161 A * 11/2009 ............. H01C 10/16 |
| DE | 41 23 249 A1   1/1993 |

(Continued)

OTHER PUBLICATIONS

Machine translation, Li B et. al, Nov. 11, 2009, China, CN 101577161 A.*

(Continued)

*Primary Examiner* — Melissa Koval
*Assistant Examiner* — Taqi Nasir
(74) *Attorney, Agent, or Firm* — Buchanan Ingersoll & Rooney PC

(57) ABSTRACT

A resistive structure has an improved electric field profile deposited on the surface of a cylindrical insulating substrate. At least one resistive path or trace is provided with a helix-looking shape and is directly printed on the surface of the insulating substrate. A resistive voltage divider includes first and second resistors electrically connected in series, where each resistor is made of one or more traces of electrically resistive film material applied onto a cylindrical insulating substrate. At least one of the traces is shaped like a helix and is applied onto the substrate by direct printing.

15 Claims, 4 Drawing Sheets

(51) Int. Cl.
*H01C 1/00* (2006.01)
*H01C 7/00* (2006.01)
*H01C 17/065* (2006.01)
*G01R 19/00* (2006.01)
*G01R 15/04* (2006.01)

(56) References Cited

U.S. PATENT DOCUMENTS

| | | | | |
|---|---|---|---|---|
| 6,258,283 | B1 * | 7/2001 | Mikami | ............... B82Y 25/00 216/22 |
| 6,593,697 | B1 | 7/2003 | Aarnink et al. | |
| 7,079,004 | B2 | 7/2006 | Budak et al. | |
| 2013/0335106 | A1 | 12/2013 | Hozoi et al. | |
| 2013/0342187 | A1 | 12/2013 | Hozoi et al. | |
| 2013/0346004 | A1 | 12/2013 | Hozoi et al. | |
| 2014/0043014 | A1 | 2/2014 | Ho et al. | |

FOREIGN PATENT DOCUMENTS

| | | | | |
|---|---|---|---|---|
| DE | 195 37 155 A1 | | 4/1997 | |
| DE | 198 41 164 A1 | | 3/2000 | |
| EP | 0 536 895 A1 | | 4/1993 | |
| GB | 735889 | * | 8/1955 | ........... H01C 17/245 |
| GB | 735889 A | | 8/1955 | |
| GB | 1 539 774 A | | 2/1979 | |
| GB | 1539774 | * | 2/1979 | ............... H01C 7/22 |
| WO | 01/33602 A1 | | 5/2001 | |

OTHER PUBLICATIONS

International Search Report (PCT/ISA/210) mailed on Aug. 21, 2012, by the European Patent Office as the International Searching Authority for International Application No. PCT/EP2012/000818.

Written Opinion (PCT/ISA/237) mailed on Aug. 21, 2012, by the European Patent Office as the International Searching Authority for International Application No. PCT/EP2012/000818.

International Search Report (Form PCT/ISA/210) issued on Apr. 26, 2012, by the European Patent Office in the International Application No. PCT/EP2012/000779. (2 pages).

International Search Report (Form PCT/ISA/210) and the Written Opinion of the International Searching Authority (Form PCT/ISA/237) issued on Apr. 27, 2012, by the European Patent Office in the International Application No. PCT/EP2012/000780. (7 pages).

International Search Report (Form PCT/ISA/210) and the Written Opinion of the International Searching Authority (Form PCT/ISA/237) issued on Apr. 27, 2012, by the European Patent Office in the International Application No. PCT/EP2012/000781. (9 pages).

* cited by examiner

RESISTIVE STRUCTURE AND RESISTIVE VOLTAGE DIVIDER ARRANGEMENT

RELATED APPLICATIONS

This application claims priority as a continuation application under 35 U.S.C. §120 to PCT/EP2012/000818, which was filed as an International Application on Feb. 25, 2012 designating the U.S., and which claims priority to European Application 11001582.3 filed in Europe on Feb. 25, 2011. The entire contents of these applications are hereby incorporated by reference in their entireties.

FIELD

The present disclosure relates to a resistive structure with an improved electric field profile deposited on the surface of an insulating substrate, and to a resistive voltage divider arrangement including such a resistive structure having first and second resistors connected in series.

BACKGROUND INFORMATION

A resistive voltage divider is provided for transforming a primary voltage to a proportional secondary voltage, whereas the secondary voltage is significantly smaller than the primary voltage, for example, between 10 times and 100000 times. For practical applications, the voltage divider ratio must feature good accuracy and stability versus influences such as temperature, aging, and applied voltage. The voltage divider may consist in its simplest form of just two serial resistors, one with a high resistance value and the other with a low or lower resistance value, as compared to the high resistance value. In more advanced cases, one or both of the serial resistors can be replaced by resistive networks having respective equivalent resistance values. These resistors or corresponding resistor networks may in the following also be called high and low ohmic resistors, respectively. The suited voltage divider ratio is achieved by scaling the resistance values of the high and low ohmic resistors and in order to achieve high division ratio, the resistance value of the high ohmic resistor are significantly higher than the resistance value of the low ohmic resistor.

Resistors to be employed at elevated or high voltages feature a high resistance value in order to limit the power dissipation and large size in order to withstand high voltages. Such resistors may be manufactured using thick film technology, such as screen printing processes, which allow for economical fabrication of resistive structures with high resistivity on substrates with various dimensions ranging from small to very large. Accordingly, the length of the substrate may range from less than one millimeter up to several hundred millimeters. Thick film resistors are made of a resistive film material which is applied in form of a trace onto an insulating substrate. The ends of the trace partly overlap with electrical terminations made of a highly conductive film, which are used for the electrical connectivity of the device. The conductive and resistive material layers are sequentially deposited on an electrically insulating substrate of planar or cylindrical shape, in order to form the electrical terminations and the resistive structure respectively. Additionally, insulating layers based on materials such as glass or polymers may also be used for isolation or protection purposes. Screen printing is the method of choice for applying the various layers mainly due to low process cost, high throughput, widespread availability, and repeatable quality. The process is applied equally well with flat or cylindrical insulating substrates which may be made of ceramic material such as aluminum oxide, however glass or polymer based substrates are also used. In known techniques, only one single layer of one single material is screen printed at a time, after which time or printing process additional process steps are required such as drying and firing, before any subsequent layer can be applied. All these process steps add to the complexity and to the cost to produce a certain structure or device, and it is therefore of high interest to reduce the number of printing steps, especially as each printing step requires additional process operations and may cause errors or irregularities in the printed structures.

Various shapes of the conductive and/or resistive structures can be screen printed by preparing appropriate masks. Additionally, a trimming operation is sometimes employed to achieve the desired shape of the printed structure or to fine tune the resistance value, where material is removed or cut subsequent to the printing process. The trimming process is thus a subtractive process, in contrast to the screen printing process, which is an additive process. Trimming is performed using techniques such as laser or mechanical cutting and induces stresses in the resistive structure which impact the long term stability and causes drifts of the resistance value. After trimming, it is thus necessary to perform a high temperature stabilization operation where the resistive structures/devices are annealed over a long period of time in order to release the stresses induced by trimming. It is the case that even after several days of stabilization the stresses are not fully removed and the resistance drift is worse than of an equivalent structure which was entirely produced by direct printing without trimming. Therefore, it is desirable to avoid trimming from both cost and accuracy considerations.

Aside from low process cost and good accuracy, one further advantage of thick film technology is the widespread availability of resistive materials with a wide range of resistivity values, for example, from less than 100 mO/sq to more than 1 GO/sq. The materials with high resistivity values often have poorer performance parameters such as temperature coefficient, voltage coefficient, noise, and stability. For applications demanding good accuracy, resistors with high ohmic value are therefore manufactured by using a narrow and long trace whose aspect ratio, given by the length over the width, is as high as possible in order to allow the use of materials with lower resistivity. Moreover, the absolute voltage coefficient of resistance is inverse proportional to the length of the resistive structure, making a long trace highly suitable.

For operation at high voltage levels, the resistive structure would ensure that the intensity of the electric field is as low as possible and uniformly distributed across the full structure. High peak values of the electric field intensity shall be avoided in order to ensure low electric stress, high voltage withstand, and good accuracy/stability of the resistance value. The optimum resistive structure must therefore provide high aspect ratio and uniform distribution of the electric field intensity.

It is known to manufacture thick film resistors with very high aspect ratio by screen printing a long and narrow resistive trace with serpentine shape on flat or cylindrical substrates, as described, for example, in EP 0536895 A 1. One advantage of the serpentine pattern is that it features very low inductance which is important for fabricating structures with small resistance value and low parasitic impedances. However, when the value of the resistance needs to be large like in all high voltage applications the parasitic value of the inductance is completely negligible and the parasitic capacitance becomes more critical. The serpentine structure is well suited for applications with low voltage levels. However, they are not suitable for high voltage levels because the serpentine shape engenders very non uniform distribution of the electric field with very high maximum values.

A known serpentine resistive structure is presented in FIG. 1, where the intensity of the electric field generated in the area enclosed between alternating lines is also shown. It is easily found that the magnitude of Ez is close to zero while the magnitude of E1 reaches very high value. The alternating distribution of the electric field intensity with very low minima and very high maxima is not suitable for withstanding high voltage. That is, the serpentine structure does not distribute evenly the voltage drop and the electric field along the resistor body and only parts of the structure have to carry the full voltage stress. Moreover, a significant gap between the rounded corners of the serpentine pattern needs to be left free both for production and electrical reasons. A small gap is difficult to fabricate but will also lead to strong electric fields between the corners of the serpentine pattern and poor voltage withstand of the resistor. The serpentine structure makes therefore ineffective use of both the length and the circumference of the resistor for withstanding the applied voltage.

For operation at a certain maximum voltage, the size of the resistive structure must be sufficiently big in order to keep the high peak values of the electric field intensity under practical limits, resulting in large size and cost of the device. Additionally, the high peak values of the electric field intensity generate stresses in the resistive structure and may lead to drifts of the resistance value, and therefore poor accuracy.

A resistive structure based on a serpentine shaped trace is thus suboptimal for use at elevated voltages and the same applies to resistors or resistive voltage dividers employing such resistive structure.

SUMMARY

An exemplary embodiment of the present disclosure provides a resistive structure having an electric field profile deposited on the surface of a cylindrical insulating substrate. The resistive structure includes at least one resistive path or trace having a helix-looking shape directly printed on a surface of the insulating substrate.

An exemplary embodiment of the present disclosure provides a resistive voltage divider which includes a first resistor and a second resistor electrically connected in series, where each resistor is made of one or more traces of electrically resistive film material applied onto a cylindrical insulating substrate. At least one of the traces has a helix-like shape and is applied onto the substrate by direct printing.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Exemplary embodiments of the disclosure provide a solution for a resistive structure with an improved profile of the electric field and an almost uniform distribution of the intensity of the electric field. The resistive structure can be directly printed on the surface of a insulating substrate using a screen printing technique, for example. Furthermore, exemplary embodiments of the present disclosure provide a resistive voltage divider or voltage divider arrangement having superior accuracy, higher voltage withstand, smaller size, and lower cost than presently known devices.

Exemplary embodiments of the present disclosure provide a resistive structure with an improved electric field profile deposited on the surface of a cylindrical insulating substrate, wherein at least one resistive path or trace has the shape looking approximately like a helix and is directly printed on the surface of the insulating substrate. Additional exemplary embodiments and developments as well as refinements of the resistive structure as well as a resistive voltage divider and a resistive voltage divider arrangement are described in more detail below.

According to an exemplary embodiment, the resistive voltage divider and/or voltage divider arrangement according to the present disclosure includes a first resistor and a second resistor electrically connected in series, wherein at least one resistor includes at least one resistive path or trace of electrically resistive film material which is shaped like a helix and which is directly printed on the surface of a cylindrical insulating substrate. The insulating substrate may in particular be a plain cylinder or a hollow cylinder.

Figure 2:
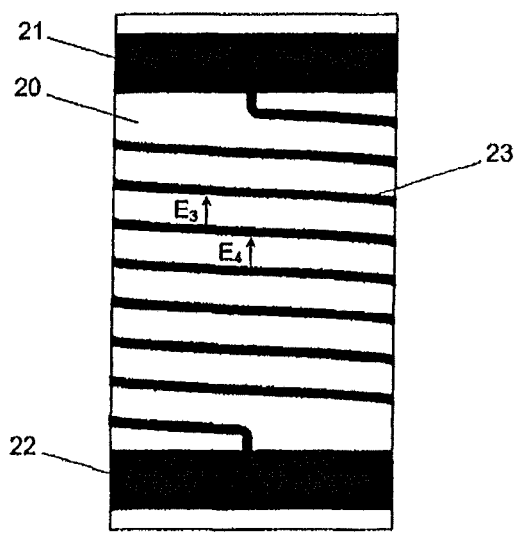
FIG. 2 shows an exemplary embodiment of a resistive structure according to the present disclosure.
Figure 3:
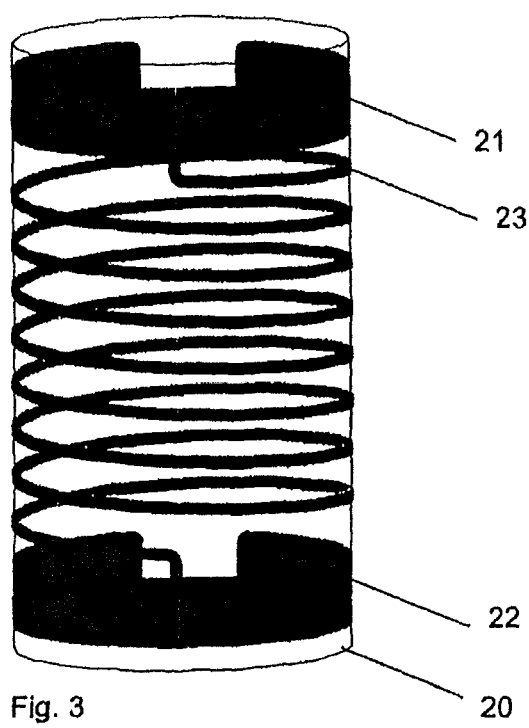
FIG. 3 shows exemplary embodiment of FIG. 2 in 3D view.

The helical structure according to an exemplary embodiment of the present disclosure is exemplified in FIGS. 2 and 3. The intensity of the electric field generated in the area enclosed between alternating lines is also shown in FIG. 2. Because the pattern is uniform and periodic from line to line, the magnitude of the electric field intensity, for example, E3 or E4, is identical at any position between two adjacent lines. The helix shaped resistive structure ensures very uniform distribution of the electric field intensity and the voltage stress is evenly distributed across the full structure and makes optimum use of the available space. It was found by the inventors of the present disclosure that the electric field intensity of the helical trace is up to two times smaller than the maximum intensity of a serpentine design with equivalent aspect ratio, when the trace width is much smaller than the trace period. In various configurations, the voltage stress of the helical trace is around 50% smaller than in an equivalent serpentine structure. The helical shape of the resistive trace or path is thus ideal for withstanding high voltages while a direct print method is suitable for achieving high accuracy, high productivity, low production effort, low cost, and high stability.

In accordance with an exemplary embodiment, the preparation or fabrication of the resistor and the resistive path or trace does not require any further subtractive process such as trimming. The helical shape of the resistive trace or path is ideal for withstanding high voltages while a direct print method is suitable for achieving high accuracy, high productivity, low production effort, low cost or effort and high stability.

In order to produce a helix like trace by screen printing, trace segments are overlapped which may result in discontinuities of the trace such as an offset or a variation of the trace width. One approach is to optimize the tolerances of the screen printing process and simply overlap the trace segments, however, the discontinuities may be poorly reproducible and may cause smearing of the trace or even contamination of the screen printing mask. The deviations can be much better controlled by introducing intentional discontinuities in the design of the structure such as a wider or a narrower section of the trace in the joining section (as exemplarily shown in FIG. 4). Excellent reproducibility can then be obtained with high throughput and without requiring adapting the existing machinery and process tools. The influence of the discontinuity on the uniformity of the electric field distribution would be negligible as compared to the serpentine shape employed in prior art structures.

Accordingly, the helix trace or path shows one or more joining sections with discontinuities such as narrower or wider trace sections periodically distributed at each full turn of the trace around the cylindrical substrate. The joining sections may use the same material than the rest of the trace or some different material, either resistive or conductive. Conductive materials are suitable for higher print resolutions and can result in significantly thinner layer and smaller trace width than with resistive materials, making finer overlaps possible. Additionally, using conductive joining sections allows printing the joining sections together with the electrical terminations of the resistive device in the same process step, which allows the trace or path structure to be tuned to the design of the resistive structure in order to achieve efficient production in common screen printing facilities and to optimize the quality, throughput, and cost.

Figure 5:
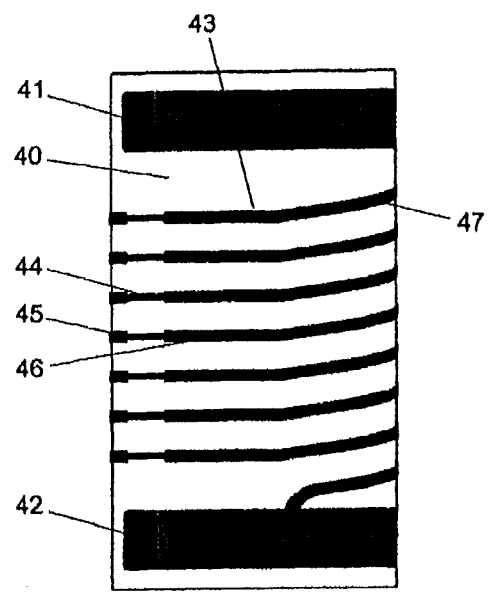

The helix like trace may feature a constant slope angle, or the slope of the trace may vary between zero degrees and some suitable value, or there may be segments with different slopes (as exemplarily shown in FIG. 5). The geometry of a trace segment is easier to control when its slope is equal to zero, that is it is approximately contained in a plane perpendicular to the axis of the cylindrical substrate. Overlapping the trace segments is also easier to achieve when their slope is around zero and it is therefore convenient to have small trace angle in the region of the joining sections.

An exemplary embodiment of the present disclosure provides a resistive voltage divider including two resistors electrically connected in series, where at least one resistor includes at least one trace which is shaped like a helix and is applied onto the substrate by a direct print method. The voltage divider may be produced by any direct print method such as screen printing, for example. The resistive voltage divider may use any feature previously described for the helix like shaped resistive structure in order to improve the accuracy, quality, throughput, and cost. The accuracy of the voltage division ratio can be further enhanced by printing all resistors of the divider on the same substrate and in the same process step and using the same resistive and conductive materials, in order to ensure very good matching of the resistance values and of properties such as the temperature coefficient of resistance.

The voltage divider employing an approximately helical resistive trace produced by direct printing on a cylindrical insulator substrate is thus especially suited to achieve high operation voltage, small size, low cost, good accuracy, and high stability. Furthermore, the present disclosure relates to a voltage sensor including a resistive voltage divider according to any of the above described exemplary embodiments.

Figure 1:
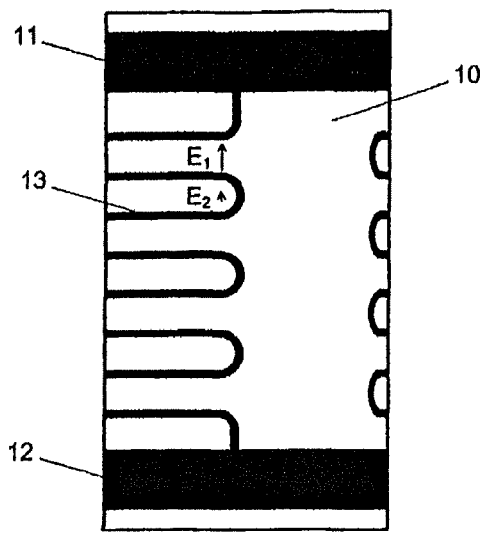
FIG. 1 shows a known high voltage resistive structure with the trace shaped like a serpentine.

The resistive structure presented in FIG. 1 is known as state of the art, where a trace 13 made of an electrically resistive material layer is directly printed on a cylindrical insulator substrate 10 and the the resistive trace 13 is shaped like a serpentine. The resistive trace 13 partly overlaps with electrical terminations 11 and 12 made of a material layer with very low resistivity. The intensity of the electric field generated in the area enclosed between alternating lines is also shown in FIG. 1, reflecting the non-uniform distribution of the voltage stress.

An exemplary embodiment of a resistive structure according to the present disclosure is schematically shown in FIG. 2, where the resistive trace 23 is directly printed, for example, by the screen printing technique or writing through one or multiple nozzles, on a cylindrical insulator substrate 20 and the the resistive trace 23 is shaped like a helix.

The resistive trace 23 partly overlaps with electrical terminations 21 and 22. Various shapes and design variations are possible for the ends of the resistive trace and for the structure of the electrical terminations, and only a simple example is shown in FIG. 2 whose focus is on the helical shape of the resistive trace. The helical shape shall not be defined by subtractive processes such as trimming and cutting which may degrade the stability of the resistor value. FIG. 2 also shows the intensity of the electric field generated in the area enclosed between alternating lines and illustrates that the magnitude of the electric field intensity is identical at any position between two adjacent lines, resulting in optimum distribution of the voltage stress.

The exemplary embodiment presented in FIG. 2 is shown from a three dimensional perspective in FIG. 3. Accordingly, regarding the features of the resistive devider of FIG. 3, reference is made to the description of FIG. 2.

Figure 4:
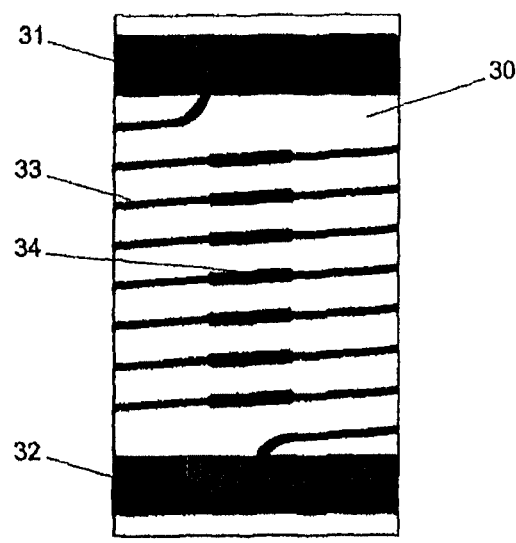
FIGS. 4 and 5 show exemplary embodiments of a helix like resistive structure according to the present disclosure.

An exemplary embodiment of a resistive devider and the respective resistive structure is shown in FIG. 4, wherein the resistive trace 33 has the shape and/or looking like a helix containing or comprising discontinuities 34 in the form of trace segments with larger width than the rest of the trace. The resistive trace is directly printed on an cylindrical insulator substrate and overlaps with electrical terminations 31 and 32, which may have in practice any suitable shape as well as the overlap regions. FIG. 5 presents an exemplary embodiment where the resistive trace 43 has the shape approximately like an helix including segments 45, 46, and 47 with different slope angles and discontinuities 44 in the form of trace segments with smaller width than the rest of the trace. For example, the segments 45 and 46 may have a slope angle equal to zero, which would facilitate a screen printing process. Also, the discontinuities 44 may be manufactured in the same printing process step as the electrical terminations 41 and 42 and using the same materials.

Figure 6:
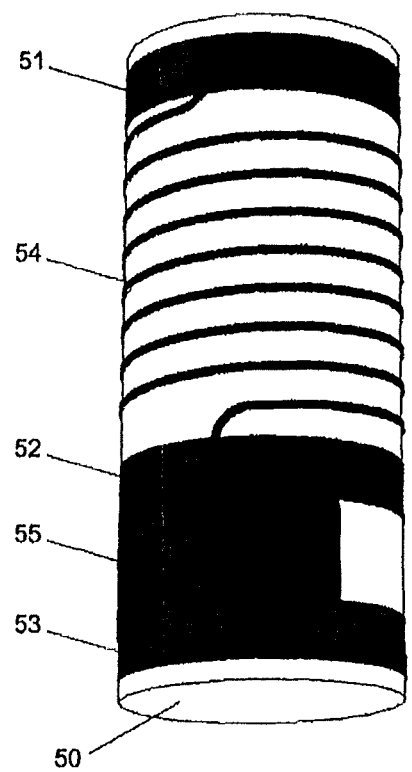
FIG. 6 shows an exemplary embodiment of a voltage divider according to the present disclosure.

In FIG. 6, an exemplary embodiment of a resistive voltage divider is presented in a three dimensional perspective, including at least two resistors electrically connected in series, where at least one resistor includes one trace 54 which is shaped like a helix and is applied onto a cylindrical insulating substrate 50 by a direct print method.

Furthermore, the resistive trace 54 partly overlaps with electrical terminations 51 and 52. Various shapes and design variations are possible for the ends of the resistive trace and for the structure of the electrical terminations 51, 52. Moreover, the second or other resistor includes one short and wide trace 55, for example, it may be shaped as an almost rectangular plane or plate, which is applied onto the surface of the same cylindrical insulating substrate 50 and partly surrounding the cylindrical insulating substrate 50 of the same cylindrical insulating substrate 50, wherein the trace 55 overlaps with electrical terminations 52 and 53. Accordingly both resistors are electrically connected in series.

Figure 7:
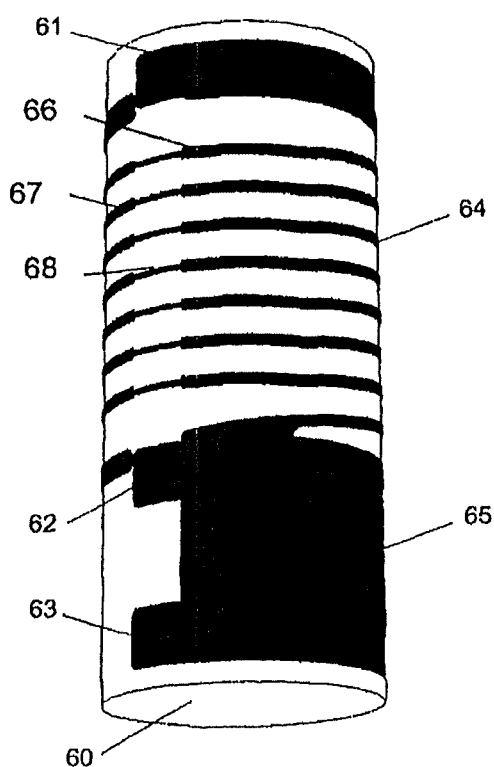
FIG. 7 shows an exemplary embodiment of a voltage divider according to the present disclosure.

In FIG. 7, an exemplary embodiment of a resistive voltage divider is presented which includes at least two resistors electrically connected in series, where at least one resistor includes one trace 64 which is shaped like a helix and is applied onto a cylindrical insulating substrate 60 by a direct print method. Furthermore, the resistive trace 64 partly overlaps with electrical terminations 61 and 62. The resistive trace 64 with a helical shape comprises segments 66, 67 and discontinuities 68 in the form of trace segments with smaller width than the rest of the trace. The discontinuities 68 may be manufactured in the same printing process step as the electrical terminations 61,62 and 63 and using the same materials.

Various shapes and design variations are possible for the ends of the resistive trace and for the structure of the electrical terminations 61,62 and 63. Moreover, the second or other resistor comprises one short and wide trace 65, which may be shaped as an almost rectangular plane or plate, which is applied onto the surface of the same cylindrical insulating substrate 60 and which is partly surrounding the cylindrical insulating substrate 60, and wherein the trace 65 overlaps with the electrical terminations 62 and 63. Accordingly, both resistors are electrically connected in series.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A resistive structure having an electric field profile deposited on the surface of a cylindrical insulating substrate, comprising:
    at least one resistive path or trace having a helix-looking shape directly printed on a surface of the insulating substrate,
    wherein the helix-like shape comprises at least one joining section which presents at least one discontinuity including at least one of a smaller trace width and a larger trace width than at least one of a rest of a helical trace and a small offset with respect to the rest of the trace.

2. The resistive structure according to claim 1, comprising: multiple joining sections are periodically placed along the length of the helix like trace.

3. The resistive structure according to claim 1, wherein ends of the resistive structure partly overlap with electrical terminations made from a highly conductive layer.

4. The resistive structure according to claim 2, where the joining sections are fabricated using a material of higher conductivity than the rest of the trace.

5. The resistive structure according to claim 4, where the joining sections and the electrical terminations are made using the same highly conductive material and are printed in the same process step.

6. The resistive structure according to claim 1, where the helix-looking shape is composed of segments oriented under at least two different angles.

7. The resistive structure according to claim 6, where the helix-looking shape comprises:
    at least one segment being approximately contained in a plane perpendicular to an axis of the cylindrical insulating substrate.

8. The resistive structure according to claim 1, wherein the helix-looking shape trace has an aspect ratio, which constitutes length over width, higher than 100.

9. The resistive structure according to claim 8, where the direct printing method is screen printing.

10. A resistive voltage divider comprising:
    a first resistor and a second resistor electrically connected in series, where each resistor is made of one or more traces of electrically resistive film material applied onto a cylindrical insulating substrate,
    wherein at least one of the traces has a helix-like shape and is applied onto the substrate by direct printing, and
    wherein the helix-like shape comprises at least one joining section which presents at least one discontinuity including at least one of a smaller trace width and a larger trace width than at least one of a rest of a helical trace and a small offset with respect to the rest of the trace.

11. The resistive voltage divider according to claim 10, wherein the first resistor and the second resistor are made using predominantly the same resistive material printed in the same process step.

12. The resistive voltage divider according to claim 11, where the direct printing method is screen printing.

13. A voltage sensor comprising:
    a resistive voltage divider according to claim 10.

14. A voltage sensor comprising:
    a resistive voltage divider according to claim 11.

15. A voltage sensor comprising:
    a resistive voltage divider according to claim 12.

* * * * *